(12) United States Patent
Radosavljevic et al.

(10) Patent No.: US 10,784,170 B2
(45) Date of Patent: Sep. 22, 2020

(54) CMOS IMPLEMENTATION OF GERMANIUM AND III-V NANOWIRES AND NANORIBBONS IN GATE-ALL-AROUND ARCHITECTURE

(71) Applicant: Intel Corporation, Santa Clara, CA (US)

(72) Inventors: Marko Radosavljevic, Portland, OR (US); Ravi Pillarisetty, Portland, OR (US); Gilbert Dewey, Beaverton, OR (US); Niloy Mukherjee, San Ramon, CA (US); Jack Kavalieros, Portland, OR (US); Willy Rachmady, Beaverton, OR (US); Van Le, Portland, OR (US); Benjamin Chu-Kung, Portland, OR (US); Matthew Metz, Portland, OR (US); Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/372,272

(22) Filed: Apr. 1, 2019

(65) Prior Publication Data

US 2019/0229022 A1 Jul. 25, 2019

Related U.S. Application Data

(60) Continuation of application No. 15/498,280, filed on Apr. 26, 2017, now Pat. No. 10,319,646, which is a
(Continued)

(51) Int. Cl.
*H01L 21/84* (2006.01)
*H01L 21/8258* (2006.01)
(Continued)

(52) U.S. Cl.
CPC ............ *H01L 21/845* (2013.01); *B82Y 10/00* (2013.01); *H01L 21/0228* (2013.01);
(Continued)

(58) Field of Classification Search
CPC .................. H01L 29/42392; H01L 21/823807
See application file for complete search history.

(56) References Cited

U.S. PATENT DOCUMENTS 6,329,677 B1 * 12/2001 Oguri .................. H01L 29/0843
257/194
7,892,945 B2 2/2011 Bedell et al.
(Continued)

FOREIGN PATENT DOCUMENTS

CN 1855390 A 11/2006
CN 101719498 A 6/2010
(Continued)

OTHER PUBLICATIONS

Office Action for Germany Patent Application No. 112011105970.1, dated Jun. 28, 2019, 14 pages, with English translation.
(Continued)

*Primary Examiner* — Farun Lu
(74) *Attorney, Agent, or Firm* — Schwabe, Williamson & Wyatt, P.C.

(57) ABSTRACT

Architectures and techniques for co-integration of heterogeneous materials, such as group III-V semiconductor materials and group IV semiconductors (e.g., Ge) on a same substrate (e.g. silicon). In embodiments, multi-layer heterogeneous semiconductor material stacks having alternating nanowire and sacrificial layers are employed to release nanowires and permit formation of a coaxial gate structure that completely surrounds a channel region of the nanowire transistor. In embodiments, individual PMOS and NMOS channel semiconductor materials are co-integrated with a
(Continued)

starting substrate having a blanket layers of alternating Ge/III-V layers. In embodiments, vertical integration of a plurality of stacked nanowires within an individual PMOS and individual NMOS device enable significant drive current for a given layout area.

14 Claims, 9 Drawing Sheets

Related U.S. Application Data continuation of application No. 14/798,380, filed on Jul. 13, 2015, now Pat. No. 9,666,492, which is a division of application No. 13/976,411, filed as application No. PCT/US2011/065914 on Dec. 19, 2011, now Pat. No. 9,123,567.

(51) Int. Cl.
| | | |
|---|---|---|
| H01L 27/092 | (2006.01) | |
| H01L 29/06 | (2006.01) | |
| H01L 29/16 | (2006.01) | |
| H01L 29/20 | (2006.01) | |
| H01L 21/306 | (2006.01) | |
| H01L 21/02 | (2006.01) | |
| H01L 21/8238 | (2006.01) | |
| H01L 29/423 | (2006.01) | |
| H01L 29/786 | (2006.01) | |
| H01L 27/12 | (2006.01) | |
| B82Y 10/00 | (2011.01) | |
| H01L 29/66 | (2006.01) | |
| H01L 29/775 | (2006.01) | |
| H01L 29/78 | (2006.01) | |
| H01L 29/205 | (2006.01) | |

(52) U.S. Cl.
CPC .. *H01L 21/02532* (2013.01); *H01L 21/02546* (2013.01); *H01L 21/30604* (2013.01); *H01L 21/8258* (2013.01); *H01L 21/823821* (2013.01); *H01L 27/092* (2013.01); *H01L 27/0922* (2013.01); *H01L 27/0924* (2013.01); *H01L 27/1211* (2013.01); *H01L 29/0673* (2013.01); *H01L 29/16* (2013.01); *H01L 29/20* (2013.01); *H01L 29/42392* (2013.01); *H01L 29/66439* (2013.01); *H01L 29/66469* (2013.01); *H01L 29/775* (2013.01); *H01L 29/78696* (2013.01); *H01L 21/823807* (2013.01); *H01L 29/205* (2013.01); *H01L 29/785* (2013.01); *H01L 29/7853* (2013.01)

(56) References Cited

U.S. PATENT DOCUMENTS

| | | |
|---|---|---|
| 2005/0136585 A1 | 6/2005 | Chau et al. |
| 2006/0216897 A1 | 9/2006 | Lee et al. |
| 2006/0240622 A1 | 10/2006 | Lee et al. |
| 2007/0090416 A1 | 4/2007 | Doyle et al. |
| 2008/0135886 A1* | 6/2008 | Irisawa ............... H01L 21/84 257/255 |
| 2008/0149919 A1 | 6/2008 | Ernst |
| 2010/0059807 A1 | 3/2010 | Cho et al. |
| 2010/0187503 A1 | 7/2010 | Moriyama et al. |
| 2010/0207208 A1 | 8/2010 | Bedell |
| 2010/0297816 A1 | 11/2010 | Bedell et al. |
| 2011/0070734 A1 | 3/2011 | Saracco et al. |
| 2011/0133167 A1 | 6/2011 | Bangsaruntip et al. |
| 2012/0007052 A1* | 1/2012 | Hobbs ............... H01L 29/42392 257/24 |

FOREIGN PATENT DOCUMENTS

| | | |
|---|---|---|
| CN | 101556922 | 7/2010 |
| CN | 102034863 | 4/2011 |
| FR | 2884648 | 10/2006 |

OTHER PUBLICATIONS

Office Action for Chinese Patent Application No. 201710001499.1, dated Jan. 28, 2019, 8 pages.
International Search Report and Written Opinion for International Application No. PCT/US2011/065914 dated Sep. 15, 2012, whole document.
Notice of Allowance (2 pages) issued by the State Intellectual Property Office (SIPO) dated Oct. 19, 2016 for Chinese Patent Application No. 201180075625.9 and English Translation (1 page) thereof.
First Office Action issued by the Chinese State Intellectual Property Office dated Apr. 1, 2016 for Chinese Patent Application No. 201180075625.9.
Office Action for Taiwan Patent Application No. 101144770 dated Jul. 27, 2014, 7 pgs., with English translation.
Notice of Allowance for Taiwan Patent Application No. 101144770 dated Jun. 4, 2015, 2 pgs., no translation.
International Preliminary Report on Patentability for International Application No. PCT/US2011/065914 dated Jul. 3, 2014, 6 pgs.
Office Action from Chinese Patent Application No. 201710001499. 1), dated Oct. 14, 2019, 6 pgs.
Office Action from German Patent Application No. 112011105970. 1, dated Mar. 30, 2020, 5 pgs.
Office Action from Chinese Patent Application No. 201710001499. 1, dated Mar. 25, 2020, 9 pgs.

* cited by examiner

CMOS IMPLEMENTATION OF GERMANIUM AND III-V NANOWIRES AND NANORIBBONS IN GATE-ALL-AROUND ARCHITECTURE

CROSS-REFERENCE TO RELATED APPLICATION

This is a Continuation of application Ser. No. 15/498,280 filed Apr. 26, 2017, which is a Continuation of application Ser. No. 14/798,380 filed Jul. 13, 2015, now U.S. Pat. No. 9,666,492 issued May 30, 2017, which is a Divisional of application Ser. No. 13/976,411 filed Jun. 26, 2013, now U.S. Pat. No. 9,123,567 issued Sep. 1, 2015 which is a U.S. National Phase application under 35 U.S.C. § 371 of International Application No. PCT/US2011/065914 filed Dec. 19, 2011, which are hereby incorporated by reference.

TECHNICAL FIELD

Embodiments of the present invention generally relate to microelectronic device architecture and fabrication, and more particularly to heterogeneous nanowire transistors for CMOS.

BACKGROUND

Silicon CMOS technology has been the mainstay of microelectronics for decades past. However, Moore's Law will at some point require extension based on non-silicon device technology. While microelectronic devices have long been fabricated in materials other than silicon, such as group III-V semiconductors, MOS technologies in these medium are considered immature from a high volume manufacturing (HVM) standpoint.

Another problem with contemporary group III-V technologies stems from the lack of reasonably well matched n-type and p-type devices because although group III-V material systems have high electron mobility, hole mobility is much lower. As such, a transition from advanced silicon CMOS to group III-V devices may entail a significant disruption to circuit design which has to-date co-evolved with silicon-based devices and come to rely on the availability of complementary transistors for CMOS logic.

Device architectures and fabrication techniques capable of implementing CMOS with group III-V-based microelectronic devices offer the advantage of extending Moore's law for decades more.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Figure 1:
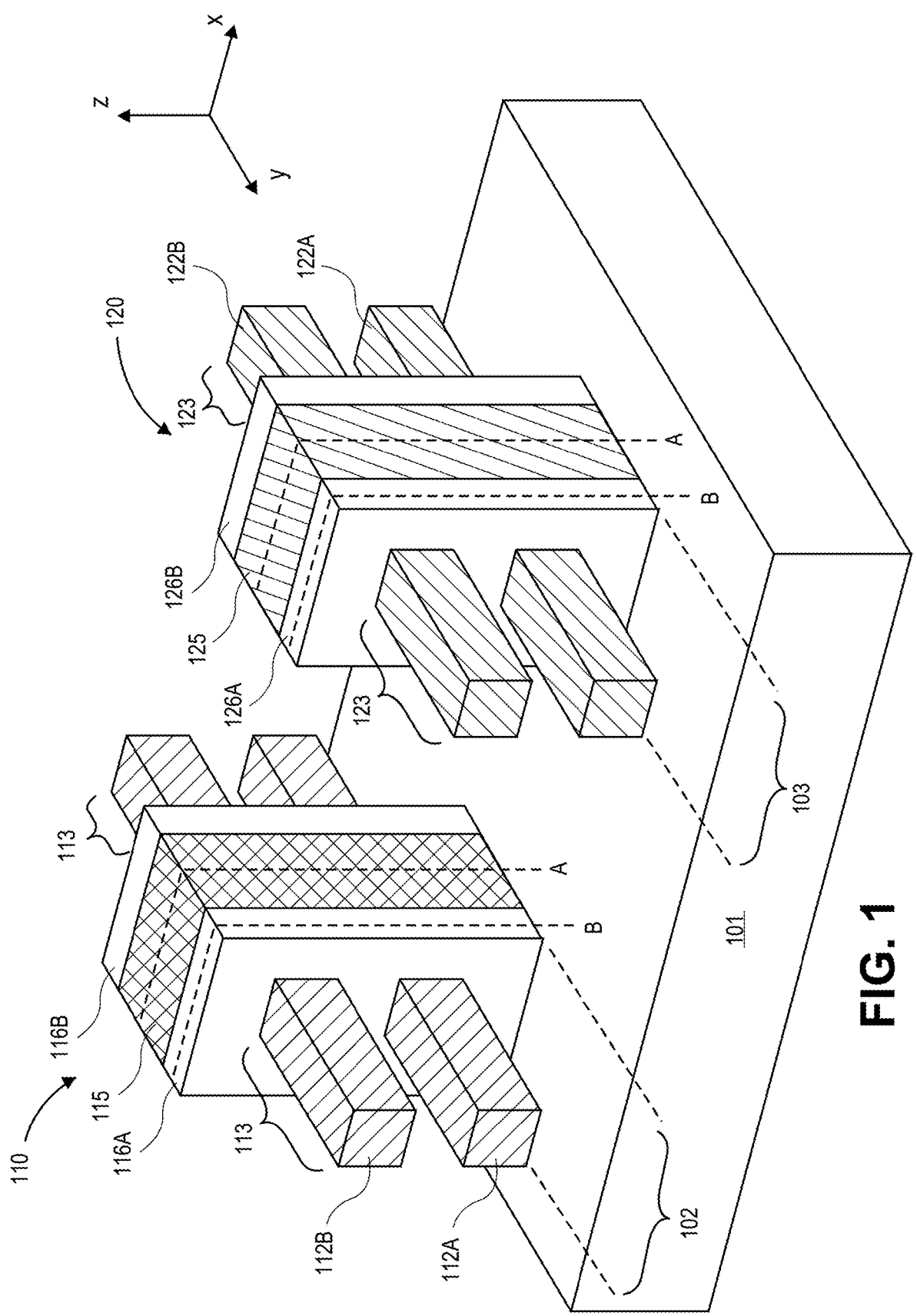
FIG. 1 is an isometric illustration of an NMOS group III-V nanowire transistor integrated with a PMOS group IV nanowire transistor on a same substrate, in accordance with an embodiment.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Described herein are architectures and techniques for co-integration of heterogeneous materials, such as group III-V semiconductor materials and group IV semiconductors (e.g., Ge) on a same substrate (e.g. silicon). In embodiments, multi-layer heterogeneous semiconductor material stacks having alternating nanowire and sacrificial layers are employed to release nanowires and permit formation of a coaxial gate structure that completely surrounds a channel region of the nanowire transistor. In embodiments, individual PMOS and NMOS channel semiconductor materials are co-integrated with a starting substrate having a blanket (i.e., full wafer) stack of alternating Ge/III-V layers. In embodiments, vertical integration of a plurality of stacked nanowires within an individual PMOS and individual NMOS device enable significant drive current for a given layout area.

FIG. 1 is an isometric illustration of a PMOS nanowire device (transistor) 110 integrated with a NMOS group III-V nanowire device (transistor) 120 on a same substrate 101, in accordance with an embodiment. The PMOS nanowire device 110 includes one or more PMOS nanowires 112A, 112B composed of a group IV semiconductor disposed over a first substrate region 102, while the NMOS nanowire device 120 includes one or more NMOS nanowires 122A, 122B composed of a group III-V semiconductor disposed over a second substrate region 103. The differing nanowire materials employed for the PMOS and NMOS devices provide a transistor-level architecture conducive to CMOS with performance capabilities that beyond silicon-based CMOS devices.

In the illustrative embodiment, the substrate 101 is silicon, insulating or semi-insulating and/or has an insulating or semi-insulating layer disposed there on, over which the PMOS device 110 and NMOS device 120 is disposed. In one such embodiment, the substrate 105 includes a top layer of buffer structure either grown on a support substrate or transferred onto a donor substrate (support and donor substrates not depicted). In a particular embodiment, the substrate 101 includes a silicon support substrate, upon which a buffer layer is epitaxially grown, however, the support substrate may also be of alternate materials, which may or may not be combined with silicon, including, but not limited to, germanium, indium antimonide, lead telluride, indium arsenide, indium phosphide, gallium arsenide, or gallium antimonide, carbon (SiC), and sapphire. In another embodiment, the substrate 101 includes a dielectric layer such as a buried oxide (BoX) which may be formed for example by transferring one or more layers of the semiconductor from which the nanowires formed onto the substrate 101.

As further illustrated in FIG. 1, for each of the PMOS and NMOS devices 110, 120, a longitudinal length of a nanowire is divided between a channel region around which gate conductors 115 and 125 wrap completely around to form a coaxial nanowire structure, extrinsic regions around which dielectric spacers 116A, 116B, 126A, and 126B are disposed, and source/drain regions 113, 123. Within at least the channel region, the nanowires 112A, 122A are physically separated from the substrate 101 by an intervening material. For the embodiments described herein, the transverse cross-sectional geometry of the nanowires 112A, 122A may vary considerably from circular to rectangular such that the thickness of the nanowires 112A, 122A (i.e., in z dimension) may be approximately equal to a width of the nanowires 112A, 122A (i.e., in x dimension) or the thickness and width of the nanowires 112A, 122A may be significantly different from each other (i.e., physically akin to a ribbon, etc.) to form cylindrical and parallelepiped semiconductor bodies. For ribbon embodiments, advantageous embodiments have a z-dimension larger than the x dimension for the sake of reduced solid angle shadowing by the nanowire thereby improving coaxial encapsulation by the gate conductors 115, 125. For the exemplary embodiments, the width of the nanowires 112A, 122A is between 5 and 50 nanometers (nm), and more particularly between 5 and 10 nm, but this may vary depending on implementation.

Generally, the nanowires 112A, 122A are crystalline with much greater long range order than a "polycrystalline" material. In the exemplary embodiment, the channel region is substantially single crystalline and although may be referred to herein as "monocrystalline," one of ordinary skill will appreciate that a low level of crystal defects may nevertheless be present as artifacts of an imperfect epitaxial growth process. At least one of the PMOS device 110 and NMOS device 120 is heterogeneous in the sense that the substrate 101 is not of the same material as at least the channel region of the nanowires 112A and/or 122A.

In the exemplary embodiment, the PMOS nanowire 112A consists essentially of germanium (Ge). Germanium is advantageous for high hole mobility and also has lattice parameters matched to some group III-V semiconductor materials sufficiently for good quality epitaxial stacks of Ge layers and group III-V semiconductor layers. Alternative embodiments where the PMOS nanowire 112A is composed of a group IV alloy (e.g., SiGe) or composed of silicon are also possible. In embodiments, the NMOS nanowire 122A consists essentially of a group III-V semiconductor material. In the exemplary embodiment where the PMOS nanowire 112A consists essentially of germanium, the NMOS nanowire 122A consists essentially of GaAs. In other embodiments, the NMOS nanowire 122A consists essentially of: InAs, a group III-N (e.g., GaN), InP, a ternary alloy comprising GaAs, a ternary alloy comprising InAs, a ternary alloy comprising InP, or a ternary alloy comprising a group III-N, or a quaternary alloy comprising GaAs, a quaternary alloy comprising InAs, a quaternary alloy comprising InP, or a quaternary alloy comprising a group III-N. In further embodiments, the channel region in both the PMOS nanowire 112A and the NMOS nanowire 122A is substantially undoped for highest carrier mobility.

As further illustrated in FIG. 1, the nanowires 112A, 122A further include source/drain region 113, 123, respectively. In embodiments, the source regions comprise the same semiconductor material present in the channel region for the respective PMOS and NMOS nanowires, but the source and drain regions further include a higher concentration of dopant. In the exemplary embodiment, the PMOS nanowire source/drain region 113 comprises a high p-type impurity (P+ dopant) while the NMOS nanowire source/drain region 123 comprises a high n-type impurity (i.e., N+ dopant). In certain embodiments, the source and drain regions maintain the same monocrystallinity as within the channel region of the nanowires 112A and 123A. In embodiments, at least one of the source/drains 113, 123 are contacted with an ohmic metal (not depicted) that coaxially wraps completely around the nanowires 112A, 122A to fill in the gaps between the nanowires and the substrate 101. The source/drain contacts may further include an epitaxially grown semiconductor of different composition than the nanowires 112A, 122A. For example, a tunnel junction (e.g., a p+ layer wrapping around the source region 123 of the nanowire 122A may provide an ultra steep turn on and off (i.e., improved sub-threshold performance). As another example, in-situ doped semiconductor may be grown completely around the released source/drains 113, 123 for lower contact resistance.

In embodiments, as shown in FIG. 1, both the PMOS nanowire device 110 and the NMOS nanowire device 120 include a vertical stack of nanowires to achieve a greater current carrying capability (e.g., larger drive currents) for a given device footprint (i.e., layout area) over the substrate 101. Any number of nanowires may be vertically stacked, depending on fabrication limitations, with the longitudinal axis of each of the nanowire substantially parallel to a top surface of the substrate 101. In the exemplary embodiment illustrated in FIG. 1, within at least the channel region, each of the PMOS nanowires 112A, 112B is of the same group IV semiconductor material (e.g., Ge). Likewise, within the channel region each of the NMOS nanowires 122A, 122B is of the same group III-V semiconductor material (e.g., GaAs). In further embodiments, each of the PMOS nanowires 112A, 112B is coaxially wrapped by the gate conductor 115 (e.g., as further shown in FIGS. 2A, 3A, 4A, 5A). Similarly, for each of the stacked nanowires contact metallization and/or raised (regrown) source/drain regions coaxially wrap completely around source/drain regions 113, 123.

FIGS. 2A, 3A, 4A, and 5A illustrate cross-sectional views along an x-z plane (demarked in FIG. 1 by the dashed line A) passing through the channel regions of the PMOS and NMOS devices 110, 120. FIGS. 2B, 3B, 4B, and 5B illustrate cross-sectional views along an x-z plane (demarked in FIG. 1 by the dashed line B) passing through an extrinsic region of the PMOS and NMOS devices 110, 120.

Figure 2A:
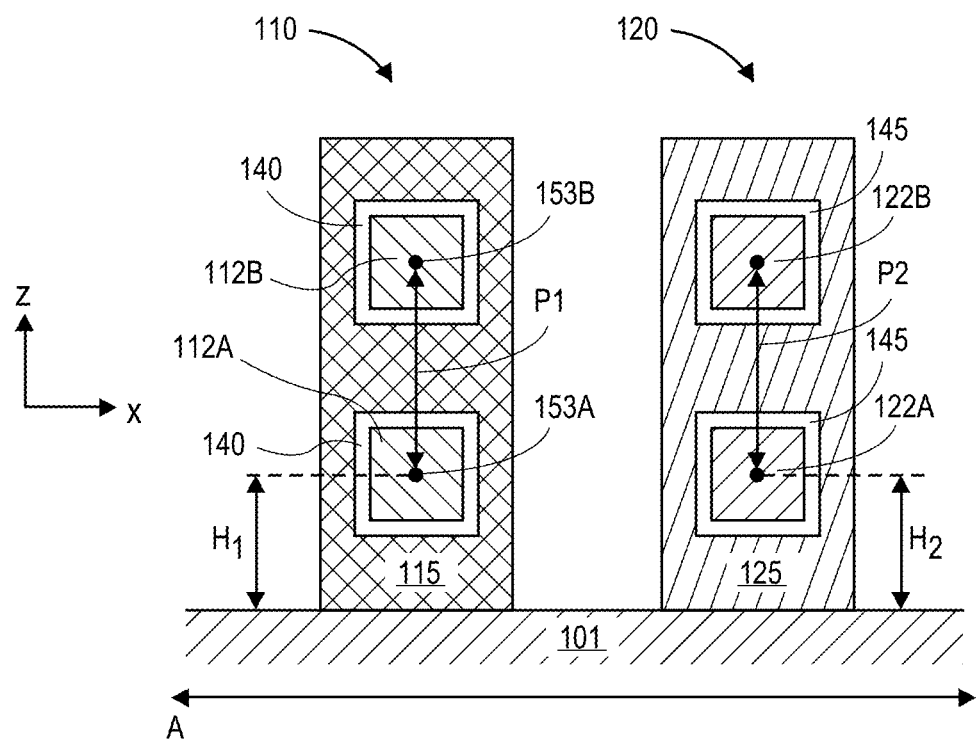
FIG. 2A is an illustration of a cross-sectional plane passing through a channel region of an NMOS group III-V nanowire transistor integrated with a PMOS group IV nanowire transistor, in accordance with an embodiment.
Figure 2B:
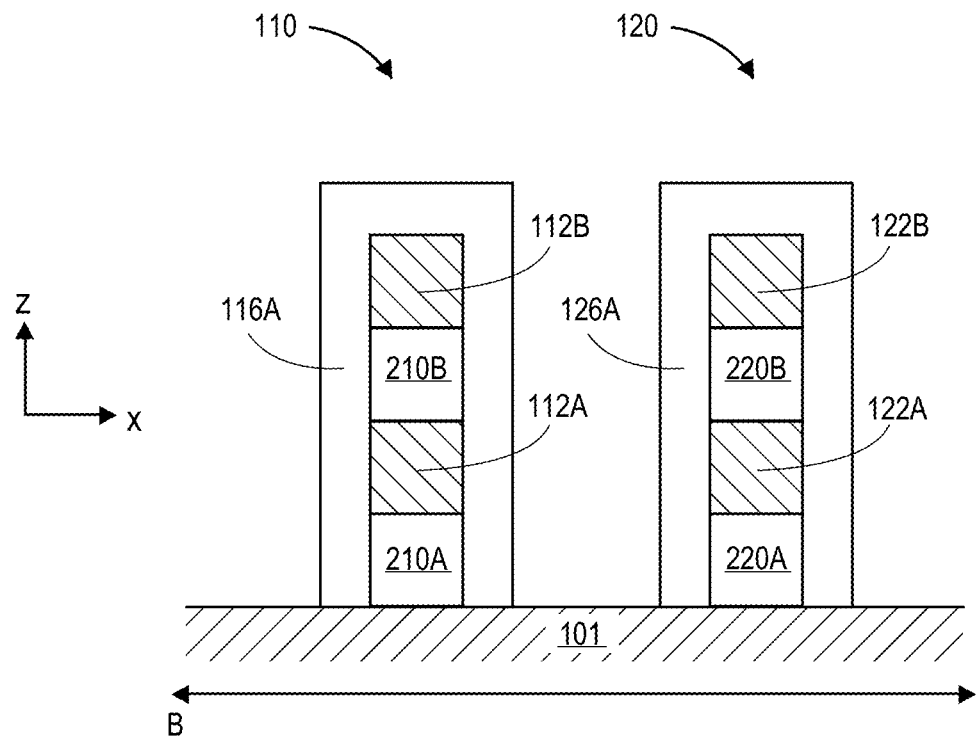
FIG. 2B is an illustration of a cross-sectional plane passing through an extrinsic region of an NMOS group III-V nanowire transistor integrated with a PMOS group IV nanowire transistor, in accordance with an embodiment.

FIGS. 2A and 2B illustrate an exemplary embodiment where the PMOS nanowires 112A, 112B are substantially coplanar with the NMOS nanowires 122A, 122B. As shown for the channel regions depicted in FIG. 2A, a longitudinal axis 153A of the PMOS nanowire 112A is disposed a first distance $H_1$ above the substrate 101 while the longitudinal axis of the NMOS nanowire 122A is disposed a second distance $H_2$ above the substrate that is substantially equal to $H_1$ (i.e., less than 10% difference). Furthermore, the pitch P1 between the longitudinal axis 153A, 153B is substantially equal (i.e., less than 10% different) to the pitch P2 between the longitudinal axis of the NMOS nanowires 122A and 122B.

FIG. 2A further illustrates the gate conductors 115 and 125 to each comport with the MOS structure of a gate conductor (140, 145) that is electrically isolated from the nanowires (112, 122) by a gate dielectric material (140, 145) disposed under the gate conductor. The coaxial nature of the wrap-around gate architecture is evident in FIG. 2A as the gate dielectric material is disposed between the substrate layer 100 and the gate conductor. The gate conductor is also disposed between the nanowires 112A, 122A and the substrate 101. Compositionally, the gate dielectric material 240 may include one or more of any material known in the art to be suitable for FET gate dielectrics (and/or channel passivation) and is preferably a high K dielectric (i.e., having a dielectric constant greater than that of silicon nitride ($Si_3N_4$)), such as, but not limited to, high K oxides like gadolinium oxide ($Gd_2O_3$), hafnium oxide ($HfO_2$), high K silicates such as HfSiO, TaSiO, AlSiO, and high K nitrides such as HfON.

Similarly, the gate conductor may be of any material known in the art for gate electrodes suitable for the particular nanowire semiconductor composition and desired threshold voltage and operative mode (enhancement or depletion). In certain embodiments the same gate dielectric material is employed for the of the PMOS gate dielectric 140 and the NMOS gate dielectric 145. Generally, the gate conductor composition includes a work function metal which may be selected to be distinct for each of the PMOS gate conductor 115 and the NMOS gate conductor 125 to obtain a desired threshold voltage ($V_t$) (e.g., greater than 0V, etc). Exemplary conductive gate materials include, tungsten (W), aluminum (Al), titanium (Ti), tantalum (Ta), nickel (Ni), molybdenum (Mo), germanium (Ge), platinum (Pt), gold (Au), ruthenium (Ru), palladium (Pd), iridium (Ir), their alloys and silicides, carbides, nitrides, phosphides, and carbonitrides thereof.

Referring to FIG. 2B, in embodiments two vertically stacked nanowires are physically joined along at least a portion of the longitudinal nanowire length where the spacer is disposed by an intervening third crystalline semiconductor material layer. For example, the PMOS nanowire 112A is joined to the substrate 101 by the intervening (third) semiconductor layer 210A while the PMOS nanowires 112A and 112B are joined together by the intervening semiconductor layer 210B. Analogously, the NMOS nanowire 122A is joined to the substrate 101 by the intervening (forth) semiconductor layer 220A while the NMOS nanowires 122A and 122B are joined together by the intervening semiconductor layer 220B. While the structure depicted in FIG. 2B may be in part an artifact of a particular fabrication process where the intervening layers 210, 220 are not completely removed (e.g., masked by the spacers 116A, 126A), it nonetheless illustrates the semiconductor material stack employed to release the nanowires in the channel regions depicted in FIG. 2A.

Generally, the intervening semiconductor layers 210A, 210B are of any sacrificial semiconductor material which can maintain the desired crystallinity of the PMOS nanowires 112A, 112B and are amenable to being removed selectively to the PMOS nanowires 112A, 112B. In the exemplary embodiment where the PMOS nanowires 112A, 112B are Ge, the sacrificial semiconductor layers 210A, 210B comprise SiGe. Likewise, the intervening semiconductor layers 220A, 220B are of any sacrificial semiconductor material which can maintain the desired crystallinity of the NMOS nanowires 122A, 122B and are amenable to being removed selectively to the PMOS nanowires 112A, 112B. In one exemplary embodiment where the NMOS nanowires 122A, 122B are GaAs, the sacrificial semiconductor layers 220A, 220B comprise AlGaAs. Notably, the thicknesses (z-dimension) of the sacrificial semiconductor layers 210, 220 may be selected as a matter of design based on desired nanowire pitch (e.g., P1, P2), gate stack deposition constraints, stack profile control, etc.

Figure 3A:
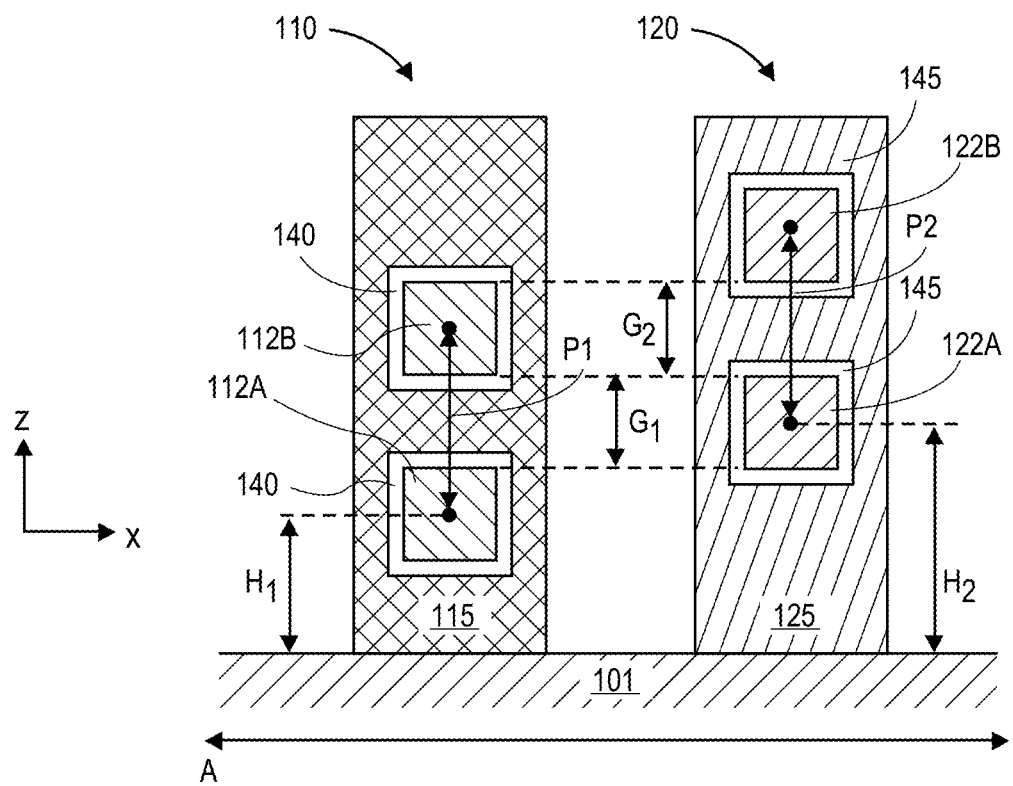
FIG. 3A is an illustration of a cross-sectional plane passing through a channel region of an NMOS group III-V nanowire transistor integrated with a PMOS group IV nanowire transistor, in accordance with an embodiment.
Figure 3B:
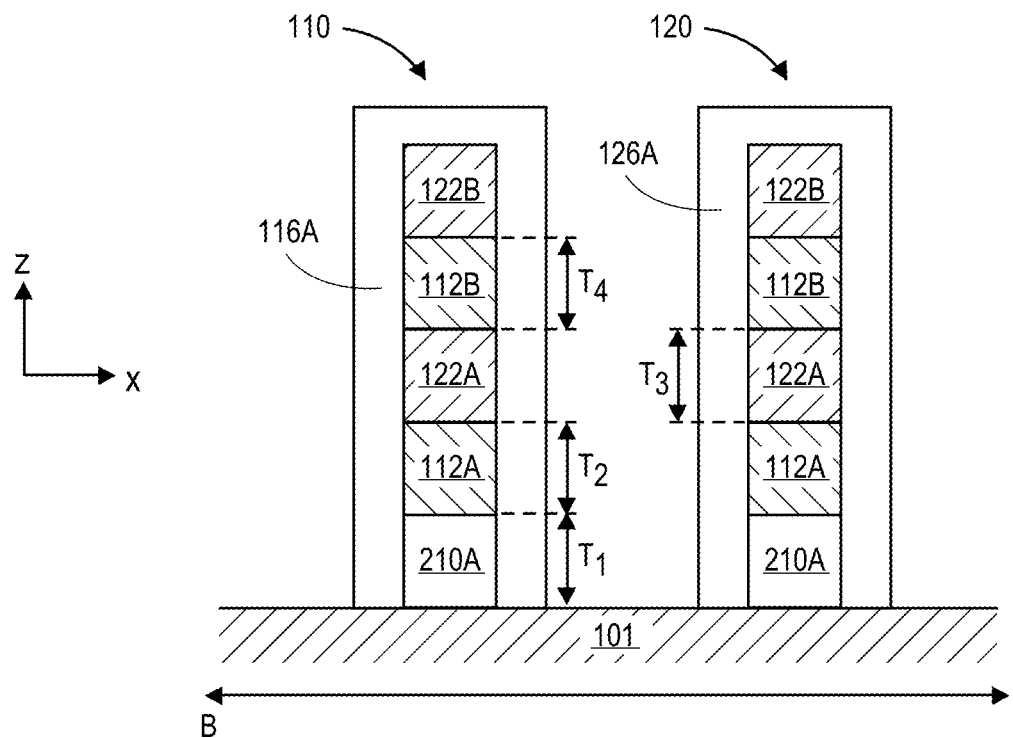
FIG. 3B is an illustration of a cross-sectional plane passing through an extrinsic region of an NMOS group III-V nanowire transistor integrated with a PMOS group IV nanowire transistor, in accordance with an embodiment.

FIGS. 3A and 3B illustrate an exemplary embodiment where the PMOS nanowires 112A, 112B are shifted or offset along the z-dimension from the NMOS nanowires 122A, 122B. As shown for the channel regions depicted in FIG. 3A, the longitudinal axis of the PMOS nanowire 112A is disposed a first distance $H_1$ above the substrate 101 while the longitudinal axis of the NMOS nanowire 122A is disposed a second distance $H_2$ above the substrate that is different than $H_1$ (i.e., significantly more than 10% different). In the illustrative embodiment, second distance $H_2$ is approximately equal to the first distance $H_1$ added to a thickness of the first channel region (z-dimension) because the nanowires 112A and 122A are substantially equal. As also shown, the gap $G_1$ between adjacent PMOS nanowires 112A, 112B is substantially equal to the thickness (diameter) of the NMOS nanowire 122A (illustrated as $T_3$ in FIG. 3B). The gap $G_2$ between adjacent NMOS nanowires 122A, 122B is substantially equal to the thickness (diameter) of the PMOS nanowire 112B (illustrated as $T_4$ in FIG. 3B). As such, the pitches P1 and P2 are substantially equal.

As further illustrated in FIG. 3B, within the extrinsic regions, the semiconductor material stack for the PMOS device 110 is the same as for the NMOS device 120. In essence, the group IV material in the PMOS nanowire (e.g., 112B) serves as a sacrificial material in the NMOS device 120 while the group III-V material in the NMOS nanowire (e.g., 122A) serves as a sacrificial material in the PMOS device 110. In the exemplary embodiment, both the PMOS device 110 and the NMOS device 120 include a group IV semiconductor (e.g., Ge) layer alternating with a group III-V semiconductor (e.g., GaAs). This dual function of the semiconductor layers is advantageous because it permits the PMOS/NMOS pair of stacks to be formed from a same blanket process that concurrently covers both the first and second regions of the substrate (e.g., regions 102 and 103 in FIG. 1).

Also shown in the embodiment of FIGS. 2A, 2B, the PMOS nanowire 112 is disposed apart from the substrate 101 by way of a third sacrificial semiconductor material 210A that is also present in the NMOS device stack. The third sacrificial material semiconductor 210A, as for FIGS. 2A, 2B, provides a standoff for the nanowire disposed closest to the substrate (e.g., PMOS nanowire 112A) to permit a wrap-around gate stack. Employed as depicted in FIGS. 2A and 2B, the third sacrificial semiconductor material 210A may be removed selectively to both the PMOS nanowire 112A and the NMOS nanowire 122A. For example, in one embodiment the third sacrificial semiconductor material 210A is group IV semiconductor (SiGe) while in another embodiment the third sacrificial semiconductor material 210A is a group III-V semiconductor material (AlGaAs). In other embodiments, the third sacrificial semiconductor material may be left as a non-functional, structural artifact in the device does not rely on the third sacrificial material as a means of nanowire release from the substrate 101 (e.g., the third sacrificial semiconductor material 210A may be left in the NMOS device 120) such that selectivity of the third sacrificial semiconductor material 210A to the group III-V material in nanowire 122A poses no issue.

FIGS. 3A and 3B illustrate an exemplary embodiment where the PMOS nanowires 112A, 112B are again substantially offset from the NMOS nanowires 122A, 122B along the z-dimension. In the third exemplary embodiment, a third sacrificial layer is disposed between adjacent layers in the alternating semiconductor material stacks as a means of decoupling the vertical spacing between nanowires in a first device (e.g., PMOS device 110) from the cross-sectional dimension (e.g., diameter or thickness in z-dimension) of a nanowire in the second device (e.g., NMOS device 120).

Figure 4A:
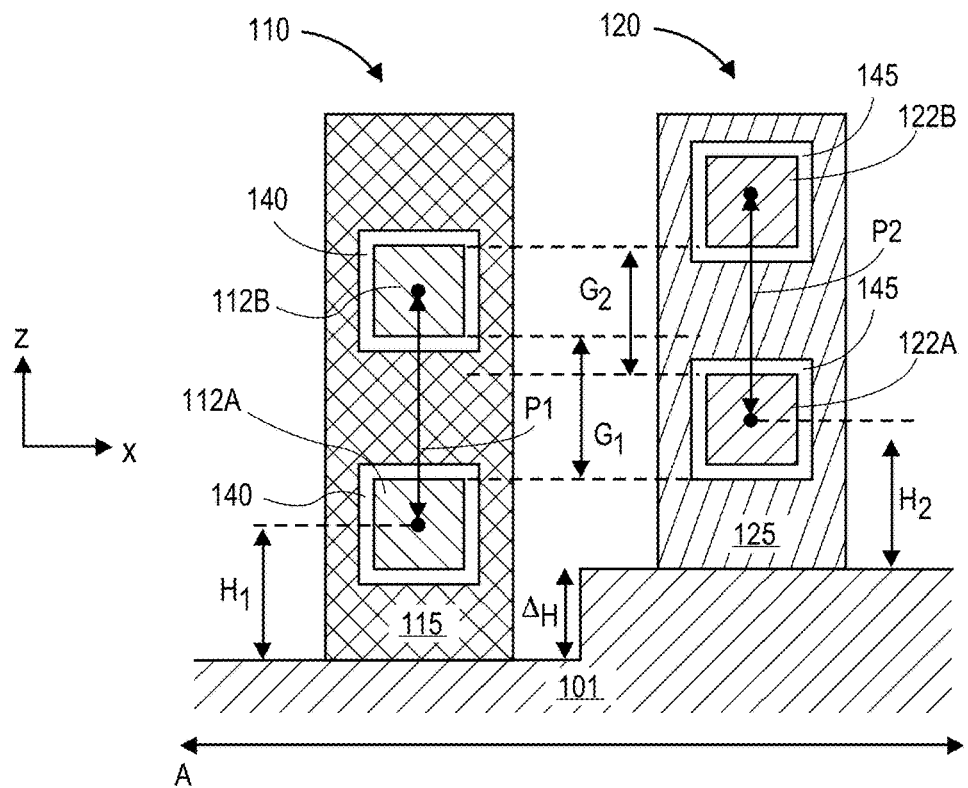
FIG. 4A is an illustration of a cross-sectional plane passing through a channel region of an NMOS group III-V nanowire transistor integrated with a PMOS group IV nanowire transistor, in accordance with an embodiment.
Figure 4B:
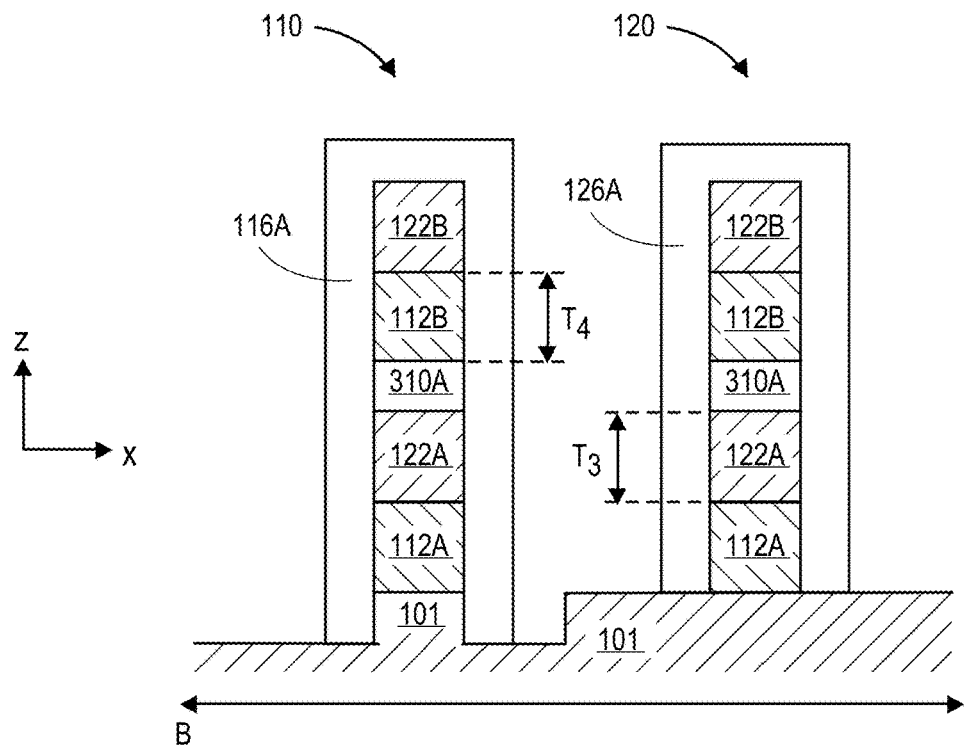
FIG. 4B is an illustration of a cross-sectional plane passing through an extrinsic region of an NMOS group III-V nanowire transistor integrated with a PMOS group IV nanowire transistor, in accordance with an embodiment.

As illustrated in FIG. 4A, the gap $G_1$ between adjacent PMOS nanowires 112A, 112B is larger than the thickness of the NMOS nanowire 122A ($T_3$, FIG. 4B) and the gap $G_2$ between adjacent NMOS nanowires 122A, 122B is larger than the thickness of the PMOS nanowire 112B ($T_4$, FIG. 4B). The larger gaps $G_1$, $G_2$ may be tailored to the demands of channel engineering and/or gate stack deposition constraints to ensure adequate fill of the gate conductors 115, 125 around the nanowires 112A, 112B, 122A, 122B. As further shown in FIG. 4B, a third sacrificial semiconductor material 310A is disposed between the nanowires 122A, 112B. In this embodiment, the third sacrificial semiconductor material 310A is again removed selectively to both the group IV material employed in the PMOS nanowire 112B and the group III-V material employed in the NMOS nanowire 122A. While many such materials exist, the preferred materials are conducive to maintaining crystallinity of the group III-V and group IV materials, for example SiGe, or AlGaAs.

FIGS. 4A and 4B further illustrate an exemplary embodiment where a recess etching the substrate 101 enables release of a nanowire (e.g., the PMOS nanowire 112A) without a third sacrificial layer disposed on the substrate 101. As shown, the substrate 101 has a recess of height ΔH sufficient to release the PMOS nanowire 112A. The portion of the recess under the channel region is backfilled with gate conductor 115. Such a structure may be achieved by undercutting the device stack in the first substrate region 102 with an etchant selective to the substrate material. With the substrate 101 recessed selectively in one of the substrate regions, the PMOS and NMOS devices 110, 120 may be formed from a same semiconductor devices stack with minimal vertical stack height.

Figure 5A:
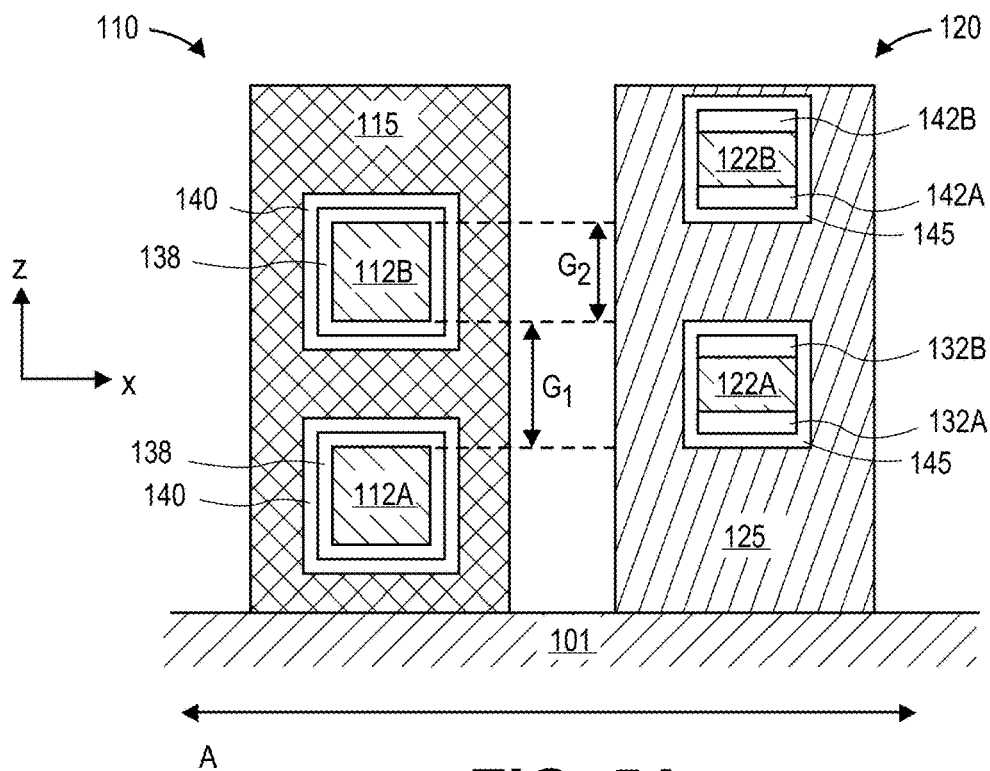
FIG. 5A is an illustration of a cross-sectional plane passing through a channel region of an NMOS group III-V nanowire transistor integrated with a PMOS group IV nanowire transistor, in accordance with an embodiment.
Figure 5B:
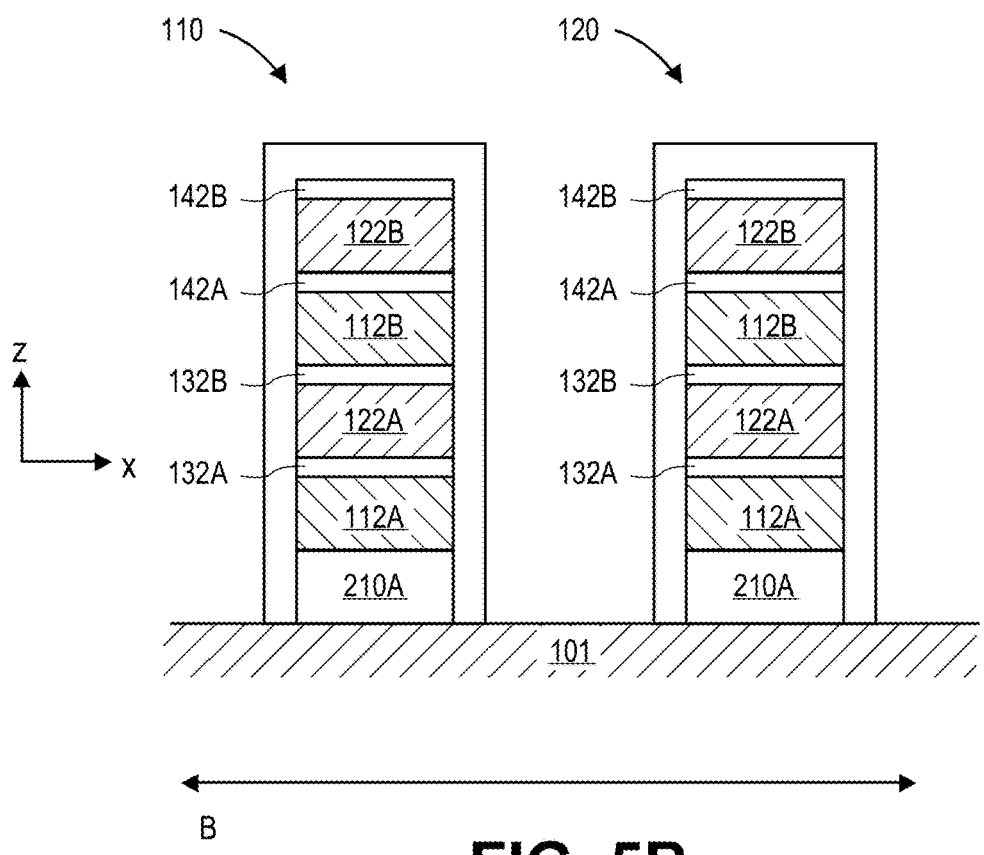
FIG. 5B is an illustration of a cross-sectional plane passing through an extrinsic region of an NMOS group III-V nanowire transistor integrated with a PMOS group IV nanowire transistor, in accordance with an embodiment.

FIGS. 5A and 5B illustrate an exemplary embodiment where a plurality of materials is employed in a nanowire of a first device. That plurality of materials is then either sacrificial in the second device or retained. As shown in FIG. 5A, the NMOS device 120 includes a nanowire 122A with a bottom and top barrier or transition layer 132A, 132B and a nanowire 122B with a bottom and top barrier or transition layer 142A, 142B. The barrier or transition layers 132A, 132B, 142A, 142B may be of a different bandgap (e.g., wider) than the nanowires 122A, 122B and may function as one or more of, a hybrid gate dielectric layer confining carriers in combination with the gate dielectric 145, a channel passivation layer, a sheet charge inducing layer, a strain layer, a channel bandgap ($V_t$) tuning layer, or the like.

As shown in FIG. 3B, the barrier or transition layers 132A, 132B, 142A, 142B are present in extrinsic regions of both the PMOS and NMOS devices 110, 120, and may either be utilized as sacrificial layer or retained as a partial cladding in the channel region of the complementary device. For example, the barrier or transition layers 132A, 132B, 142A, 142B may be utilized in the PMOS device 110 in one of the functional capacities described above for the NMOS device 120. However, in the embodiment illustrated by FIG. 5A, the barrier or transition layers 132A, 132B, 142A, 142B are removed from the PMOS nanowires 112A, 112B as sacrificial along with the group III-V semiconductor utilized for the NMOS nanowires 122A, 122B. In this exemplary embodiment, the larger gap $G_1$ resulting from removing the barrier or transition layers 132A, 132B then provides more room for a separate channel transition layer 138, which like the gate dielectric 140 and gate conductor 115, may wrap around the PMOS nanowires 112A, 112B. Likewise, a larger gap G2 is provided by removing barrier or transition layers 142A, 142B.

Figure 6:
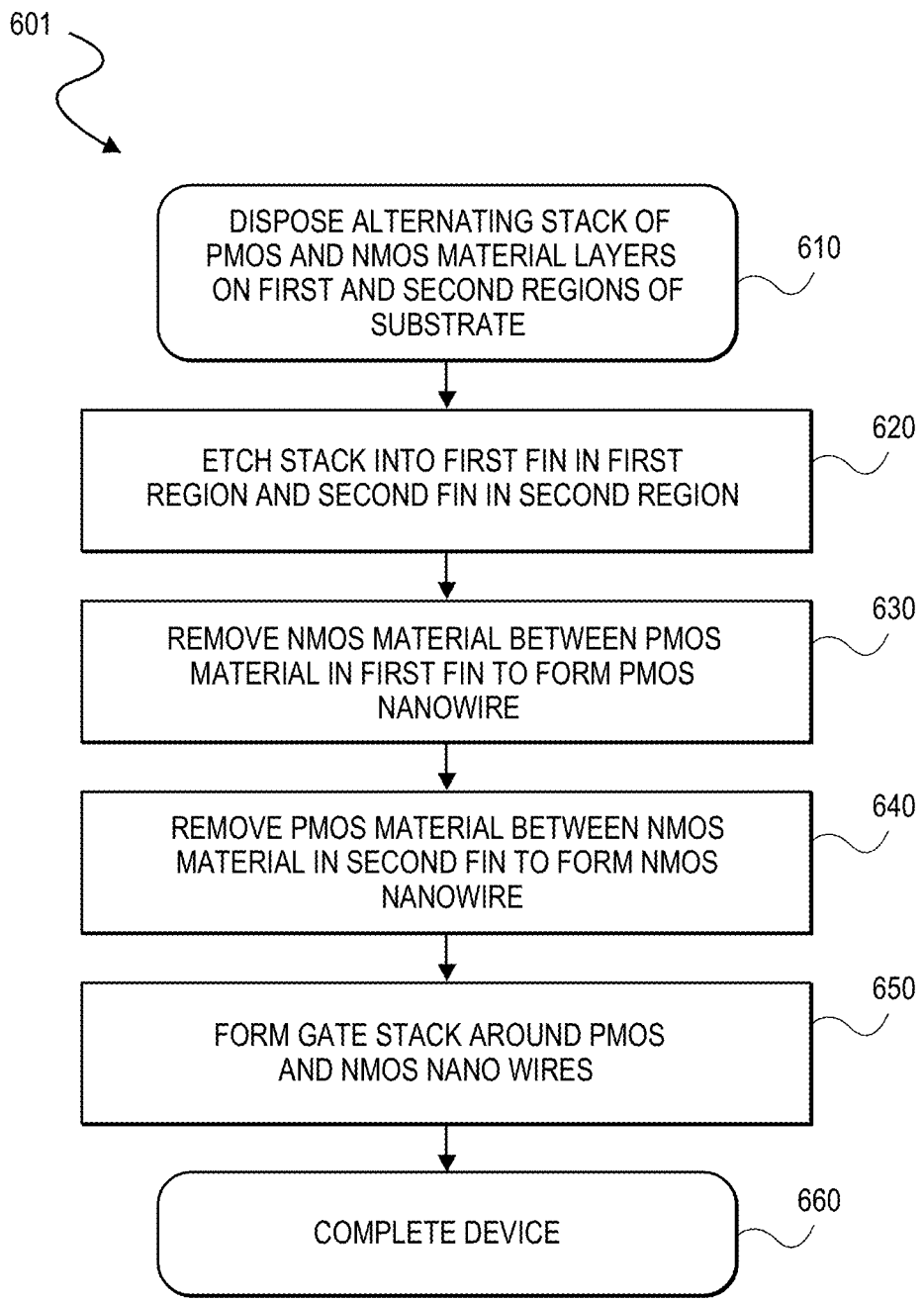
FIG. 6 is a flow diagram illustrating a method of fabricating a NMOS group III-V nanowire transistor integrated with a PMOS group IV nanowire transistor on a same substrate, in accordance with an embodiment.
Figure 7:
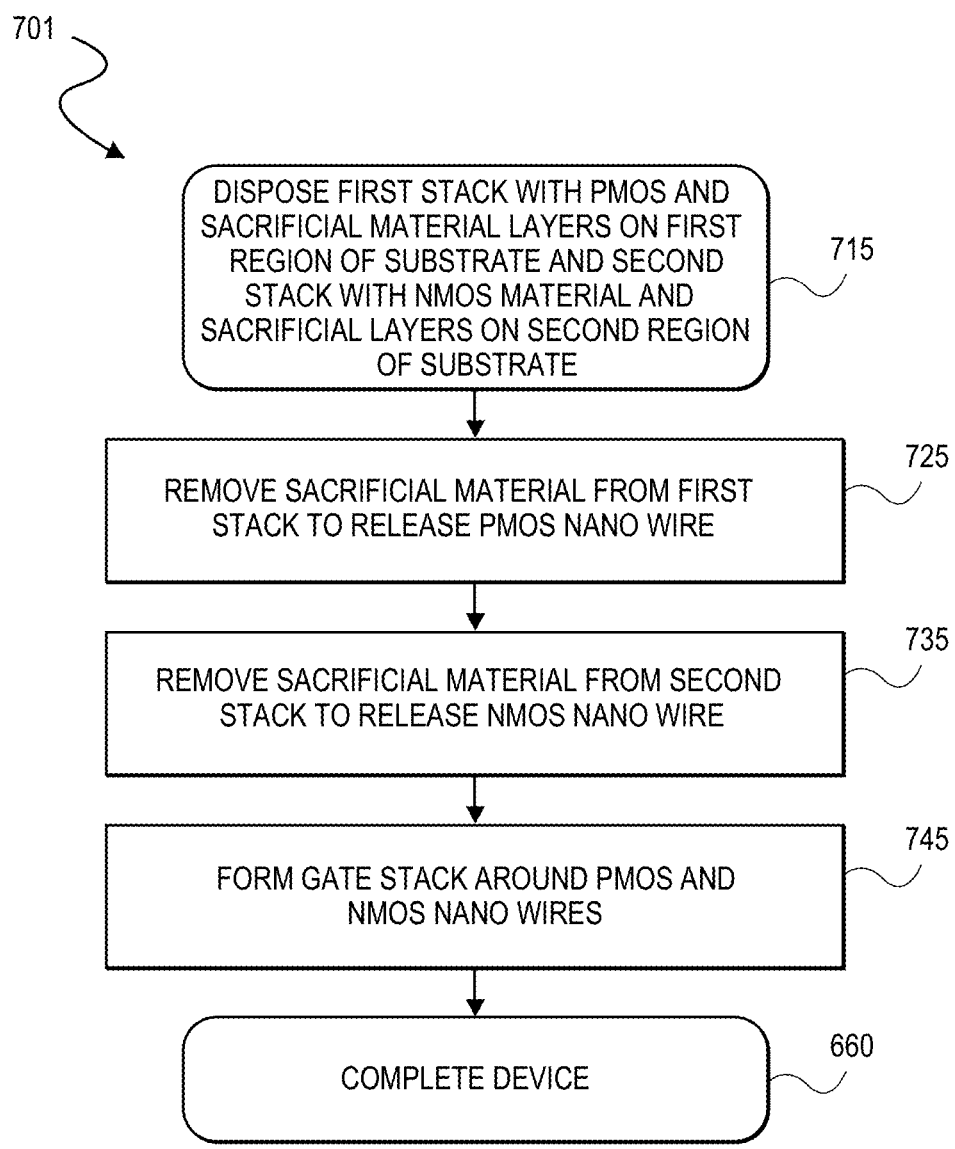
FIG. 7 is a flow diagram illustrating a method of fabricating a NMOS group III-V nanowire transistor integrated with a PMOS group IV nanowire transistor on a same substrate, in accordance with an embodiment.
Figure 8A:
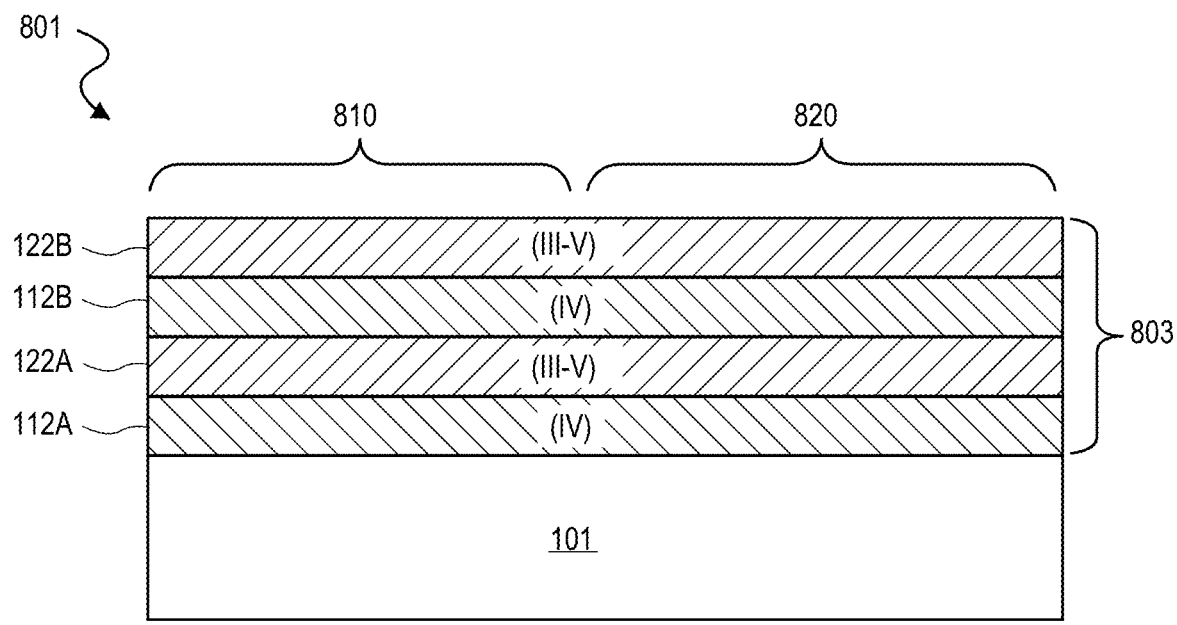
FIGS. 8A and 8B are a cross-sectional illustration of starting substrates for fabricating a NMOS group III-V nanowire transistor integrated with a PMOS group IV nanowire transistor, in accordance with an embodiment of the present invention.

A brief description of salient portions of fabrication process embodiments is now provided. FIGS. 6 and 7 are flow diagram illustrating methods 601 and 701 of fabricating a NMOS group III-V nanowire transistor integrated with a PMOS group IV nanowire transistor on a same substrate, in accordance with embodiments of the present invention. While methods 601 and 701 highlight certain operations, those operations may entail many more process sequences, and no order is implied by the numbering of the operations or relative positioning of the operations in FIGS. 6 and 7. Generally, the method 601 utilizes a starting substrate having a blanket deposited semiconductor stack that is the same in two regions of the substrate 810, 820, as illustrated in FIG. 8A, while the method 701 entails a starting substrate having materially distinct stacks disposed in the two regions of the substrate 810, 820.

Referring first to FIG. 6, the method 601 begins at operation 610 with an alternating stack of PMOS and NMOS semiconductor material layers disposed on the first and second regions of the substrate. For example, in the illustrative embodiment depicted in FIG. 8A, the starting substrate 801 has a same stack of semiconductor materials 803 in which group IV semiconductor layers alternate with group III-V semiconductor layers disposed over both the regions 810 and 820. The alternating stack of semiconductor materials 803 may be epitaxially grown on the substrate 101 or transferred and bonded.

Subsequently, at operation 620 the stack 803 is etched, for example by anisotropic plasma etch, into a first fin in the first region 810 and a second fin in the second region 820. Depending on the group IV and group III-V materials, one or more plasma etch processes based on conventional techniques may be utilized. At operation 630, NMOS material is removed from the first fin to form a gap between the group IV semiconductor layer and the substrate 101 to release the PMOS nanowires along a longitudinal channel length. For example, in the starting material 801 (FIG. 8A) the group III-V layers are removed within the first region 810 selectively to the group IV layers using conventional techniques (e.g., isotropic wet and/or dry etch chemistries) to release PMOS nanowires 112A, 112B. At operation 640, PMOS material is removed from the second fin selectively to the group III-V semiconductor layer to form a gap between the group III-V semiconductor layer and the substrate to release the NMOS nanowires along at least their longitudinal channel lengths. For example, in the stack 803 (FIG. 8A), within the second region 820, the group IV layers are removed selectively to the group III-V layers to release the NMOS nanowires 122A and 122B.

At operation 650, gate stacks are then formed completely around the PMOS and NMOS nanowires (i.e., a coaxial structure) using any conventional deposition technique as a function of the materials utilized. In particular embodiments, replacement gate techniques are utilized, as known in the art for non-planar silicon transistor technologies. In one embodiment, a sacrificial gate (stack) is formed, source and drain regions in the nanowires 112A, 112B are doped p-type, and source and drain regions in the nanowires 122A, 122B are doped n-type (and/or wrapped with raised source drain regions), the sacrificial gate removed, and the non-sacrificial gate stack formed. Exemplary techniques for forming the non-sacrificial gate include atomic layer deposition (ALD) for high-K gate dielectric material, and ALD or physical vapor deposition (PVD) for gate conductor materials. Method 601 is then completed at operation 660 with conventional processing (e.g., interlayer dielectric formation, source and drain contact formation on each of the PMOS and NMOS devices, etc.).

Figure 8B:
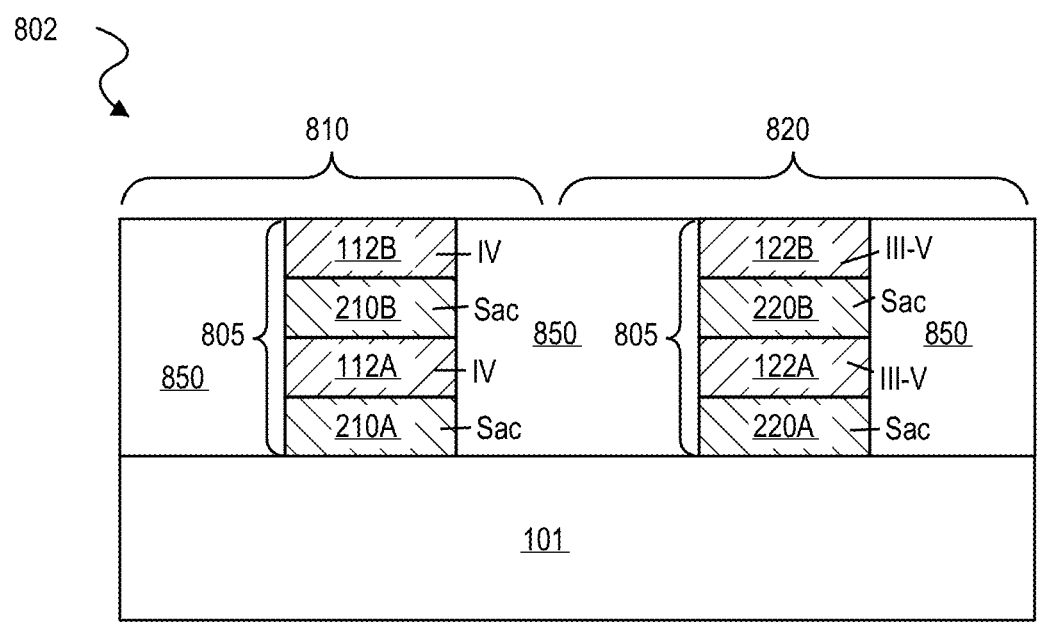

Referring next to FIG. 7, the method 701 begins at operation 715 with a first stack of alternating PMOS semiconductor material layers and a first sacrificial material disposed on the first region of the substrate and a second stack of alternating NMOS semiconductor material layers and a second sacrificial material disposed on the second region of the substrate. For example, in the illustrative embodiment depicted in FIG. 8B, the starting material 802 includes a first stack of semiconductor materials 804, with the group IV semiconductor layers alternating with first sacrificial material layers 210A, 210B, disposed over a first substrate region 810. The starting material 802 further includes a second stack of semiconductor materials 805, with the group III-V semiconductor layers alternating with second sacrificial semiconductor material 220A, 220B, disposed over the second substrate region 820. For this embodiment, each distinct alternating stack of semiconductor materials may be epitaxially grown on the substrate 101 (e.g., in the trenches formed in field isolation dielectric layer 850) and then sidewalls of the materials exposed (e.g., by recessing the field isolation dielectric layer 850).

At operation 725 the first sacrificial material layers 210A, 210B are removed by an etchant selective over the group IV semiconductor materials to form the PMOS nanowires 112A, 112B to release the PMOS nanowires 112A, 112B. At operation 735, the second sacrificial material layers 220A, 220B are removed by an etchant selective over the group III-V semiconductor layers to release the NMOS nanowires 122A, 122B. At operation 745 gate stacks are formed completely around the released channel regions of the PMOS and NMOS nanowires (i.e., workfunction metals forming a coaxial structure with the nanowires) using any conventional deposition technique as a dependent on the workfunction and capping materials utilized. In particular embodiments, replacement gate techniques are utilized, as known in the art for non-planar silicon transistor technologies. In one embodiment, a sacrificial gate (stack) is formed, source and drain regions in the nanowires 112A, 112B are doped p-type, and source and drain regions in the nanowires 122A, 122B are doped n-type (and/or wrapped with raised source drain regions), the sacrificial gate removed, and the non-sacrificial gate stack formed. Method 701 is then completed at operation 660 with conventional processing (e.g., interlayer dielectric formation, source and drain contact formation on each of the PMOS and NMOS devices, etc.).

In either method 601 or 701 it is understood that the semiconductor stacks disposed on the substrate may further include one or more of the intervening semiconductor layers described elsewhere herein (e.g., by epitaxially growing a third sacrificial layer over the substrate in the first and second regions 810, 820). For such embodiments, operations 620 and 725 then further include etching the third sacrificial layer selectively to the group IV semiconductor layer to form a gap between the group IV semiconductor layer and the substrate in the first region 810 that is wider than a thickness of the group III-V semiconductor layer. Similarly, the third sacrificial layer is further etched selectively to the group III-V semiconductor layer to form a gap between the group III-V semiconductor layer and the substrate in the second region 820 that is wider than a thickness of the group IV semiconductor layer.

Figure 9:
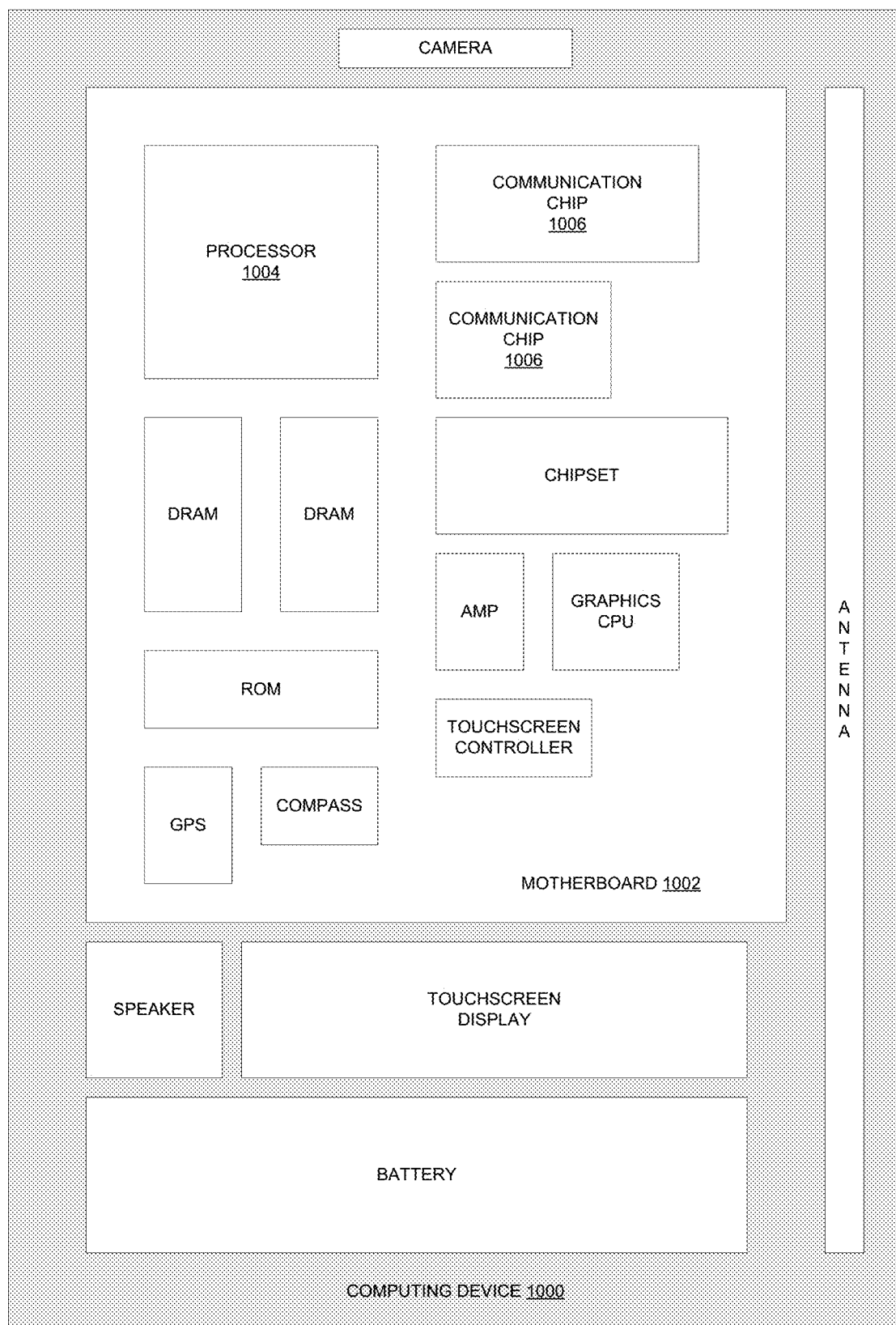
FIG. 9 illustrates a illustrates a computing device in accordance with one implementation of the invention.

FIG. 9 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as the PMOS device 110 and NMOS device 120 (FIG. 1) in accordance with embodiments described elsewhere herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as the PMOS device 110 and NMOS device 120 (FIG. 1) in accordance with embodiments described elsewhere herein.

In further implementations, another component housed within the computing device 1000 may contain an integrated circuit die that includes one or more devices, such as the PMOS device 110 and NMOS device 120, as illustrated in FIG. 1 and described elsewhere herein.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. An integrated circuit structure, comprising:
   a first semiconductor device over a substrate, wherein the first semiconductor device comprises:
      a group IV semiconductor nanowire channel region above a planar surface of the substrate;
      a first source region and a first drain region electrically coupled with the group IV semiconductor nanowire channel region; and
      a first gate stack comprising a gate insulator and a gate conductor coaxially wrapping completely around the group IV semiconductor nanowire channel region, the first gate stack having a bottom surface; and
   a second semiconductor device over the substrate, wherein the second semiconductor device comprises:
      a group III-V semiconductor nanowire channel region above the planar surface of the substrate, wherein the group III-V semiconductor nanowire channel region is non-co-planar with the group IV semiconductor nanowire channel region;
      a second source region and a second drain region electrically coupled with the group III-V semiconductor nanowire channel region; and
      a second gate stack comprising a gate insulator and a gate conductor coaxially wrapping completely around the group III-V semiconductor nanowire channel region, the second gate stack having a bottom surface, wherein the bottom surface of the second gate stack is co-planar with the bottom surface of the first gate stack.

2. The integrated circuit structure of claim 1, wherein the first source region and first drain region are p-type, and wherein the second source region and second drain region are n-type.

3. The integrated circuit structure of claim 1, wherein the group IV semiconductor nanowire channel region consists of germanium (Ge).

4. The integrated circuit structure of claim 1, wherein the Group IV semiconductor nanowire channel region is within a vertical stack of Group IV semiconductor nanowire channel regions.

5. The integrated circuit structure of claim 1, wherein the Group III-V semiconductor nanowire channel region is within a vertical stack of Group III-V semiconductor nanowire channel regions.

6. The integrated circuit structure of claim 1, wherein the Group IV semiconductor nanowire channel region is within a vertical stack of Group IV semiconductor nanowire channel regions, wherein the Group III-V semiconductor nanowire channel region is within a vertical stack of Group III-V semiconductor nanowire channel regions, and wherein the Group IV semiconductor nanowire channel regions are laterally adjacent to vertical spaces between the Group III-V semiconductor nanowire channel regions.

7. The integrated circuit structure of claim 1, further comprising:
a barrier layer on top and bottom surfaces of the group III-V semiconductor nanowire channel region, the barrier layer having a band gap wider than a band gap of the group III-V semiconductor nanowire channel region.

8. The integrated circuit structure of claim 1, further comprising:
a transition layer wrapping around the group IV semiconductor nanowire channel region.

9. A method of fabricating an integrated circuit structure, the method comprising:
forming a first semiconductor device over a substrate, wherein forming the first semiconductor device comprises:
forming a group IV semiconductor nanowire channel region above a planar surface of the substrate;
forming a first source region and a first drain region electrically coupled with the group IV semiconductor nanowire channel region; and
forming a first gate stack comprising a gate insulator and a gate conductor coaxially wrapping completely around the group IV semiconductor nanowire channel region, the first gate stack having a bottom surface; and
forming a second semiconductor device over the substrate, wherein forming the second semiconductor device comprises:
forming a group III-V semiconductor nanowire channel region above the planar surface of the substrate, wherein the group III-V semiconductor nanowire channel region is non-co-planar with the group IV semiconductor nanowire channel region;
forming a second source region and a second drain region electrically coupled with the group III-V semiconductor nanowire channel region; and
forming a second gate stack comprising a gate insulator and a gate conductor coaxially wrapping completely around the group III-V semiconductor nanowire channel region, the second gate stack having a bottom surface, wherein the bottom surface of the second gate stack is co-planar with the bottom surface of the first gate stack.

10. The method of claim 9, wherein the first source region and first drain region are p-type, and wherein the second source region and second drain region are n-type.

11. The method of claim 9, wherein the group IV semiconductor nanowire channel region consists of germanium (Ge).

12. A computing device, comprising:
a board; and
a component coupled to the board, the component including an integrated circuit structure, comprising:
a first semiconductor device over a substrate, wherein the first semiconductor device comprises:
a group IV semiconductor nanowire channel region above a planar surface of the substrate;
a first source region and a first drain region electrically coupled with the group IV semiconductor nanowire channel region; and
a first gate stack comprising a gate insulator and a gate conductor coaxially wrapping completely around the group IV semiconductor nanowire channel region, the first gate stack having a bottom surface; and
a second semiconductor device over the substrate, wherein the second semiconductor device comprises:
a group III-V semiconductor nanowire channel region above the planar surface of the substrate, wherein the group III-V semiconductor nanowire channel region is non-co-planar with the group IV semiconductor nanowire channel region;
a second source region and a second drain region electrically coupled with the group III-V semiconductor nanowire channel region; and
a second gate stack comprising a gate insulator and a gate conductor coaxially wrapping completely around the group III-V semiconductor nanowire channel region, the second gate stack having a bottom surface, wherein the bottom surface of the second gate stack is co- planar with the bottom surface of the first gate stack.

13. The computing device of claim 12, further comprising:
a memory coupled to the board.

14. The computing device of claim 12, further comprising:
a communication chip coupled to the board.

* * * * *